US009870011B2

(12) United States Patent
Illing et al.

(10) Patent No.: US 9,870,011 B2
(45) Date of Patent: Jan. 16, 2018

(54) CIRCUIT ARRANGEMENT AND A METHOD FOR OPERATING A CIRCUIT ARRANGEMENT

(71) Applicant: Infineon Technologies AG, Neubiberg (DE)

(72) Inventors: Robert Illing, Finkenstein (AT); Alexander Mayer, Treffen (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 288 days.

(21) Appl. No.: 14/609,454

(22) Filed: Jan. 30, 2015

(65) Prior Publication Data

US 2016/0224041 A1 Aug. 4, 2016

(51) Int. Cl.

| | |
|---|---|
| ***H03K 3/00*** | (2006.01) |
| ***G05F 1/575*** | (2006.01) |

(52) U.S. Cl.

CPC .................................... *G05F 1/575* (2013.01)

(58) Field of Classification Search

CPC ............. G05F 1/575; G05F 1/577; G05F 1/59
See application file for complete search history.

(56) References Cited

U.S. PATENT DOCUMENTS

| | | | | |
|---|---|---|---|---|
| 7,605,598 B2 | 10/2009 | Kelly | | |
| 8,471,605 B2 * | 6/2013 | Lee | .................... | H05B 33/0827 327/108 |
| 2010/0079120 A1 | 4/2010 | Arndt | | |

* cited by examiner

*Primary Examiner* — Kenneth B Wells
(74) *Attorney, Agent, or Firm* — Viering, Jentschura & PartnermbB

(57) ABSTRACT

According to various embodiments, a circuit arrangement may be provided, comprising a driver circuit configured to deliver a switching signal to a power switch such that the power switch controls a load current, a gate-back regulation circuit selectively connected to the driver circuit and the load current, and a diagnostic circuit configured to provide an enabling signal, which allows the gate-back regulation circuit to become active; and wherein the enabling signal is dependent at least in part on a condition independent of the load current.

18 Claims, 7 Drawing Sheets

(PRIOR ART)

(PRIOR ART)

(PRIOR ART)

CIRCUIT ARRANGEMENT AND A METHOD FOR OPERATING A CIRCUIT ARRANGEMENT

TECHNICAL FIELD

Various aspects relate to a circuit arrangement and a method for operating a circuit arrangement.

BACKGROUND

In circuit arrangements which have a power transistor for switching or regulating a current flowing through a load, it may be necessary to measure a load current flowing through the power transistor. A sense transistor is provided which is connected in such a way that it is operated at approximately the same source, gate, and drain voltages as the power transistor, i.e., the same operating point. The current through the sense transistor is then directly related to the load current; the ratio of the currents through the power and the sense transistors is called KILIS ("K"):

$$K = \frac{I_{load}}{I_{sense}}.$$

If operated at exactly the same operating point, K will remain constant. However, due to manufacturing differences, the transistors are not operated at the same operating point. K will have a "spread" between a minimum and a maximum value. As the accuracy of K is important for the circuit arrangement, this spread should be kept within prescribed bounds. FIG. 7 illustrates typical diagnosis behavior of K for a diagnosis current proportional to a load current under different operating conditions. In particular, maximum and minimum values of K at various load currents are shown, indicating the spread of K.

With gate back regulation ("GBR") the power and sense transistors are operated at a constant drain voltage. It is common to use GBR to improve accuracy at low load currents. The principle is to regulate the drain-source voltage to a constant voltage by decreasing the gate voltage.

In systems with GBR, sudden activation of a high-current load can cause a load step (i.e., a current jump) of sufficient magnitude resulting in a significant voltage drop over a corresponding module switch. The normal lag in operation of GBR during a load step with such a voltage drop may inadvertently trigger an under-voltage shutdown in a microcontroller. This case is illustrated in FIGS. 8A and 8B, in which a circuit arrangement 800 includes a module 801, a pre-regulator 804, a microcontroller 803, and a load switch 802. In case module 801 is turned on, the current ($I_{OUT}$ in FIGS. 8A and 8B) may be low, such that module 801 operates in GBR mode. Load switch 802 is turned on, causing $V_{OUT}$ to decrease, which requires some time to return to its previous level. An undervoltage condition, as seen in FIG. 8B, could then occur.

Additionally, power consumption may be affected by whether GBR mode is used. This is illustrated in FIG. 9, which compares power consumption for various currents with and without GBR mode.

SUMMARY OF THE INVENTION

In one embodiment, a circuit arrangement is provided which includes a driver circuit configured to deliver a switching signal to a power switch such that the power switch controls a load current, a gate-back regulation circuit selectively connected to the driver circuit and the load current, and a diagnostic circuit configured to provide an enabling signal, which allows the gate-back regulation circuit to become active. The enabling signal is dependent at least in part on a condition independent of the load current.

In another embodiment, a circuit arrangement is provided which includes a plurality of driver circuits, wherein each driver circuit comprises a power switch and is configured to deliver a switching signal to the power switch such that the power switch controls a respective load current, a gate-back regulation circuit selectively connected to the plurality of power circuits and the plurality of load currents, and a diagnostic circuit configured to provide an enabling signal, which allows the gate-back regulation circuit to become active. The enabling signal is dependent on at least a condition independent of the plurality of load currents.

According to further embodiments, methods for operating a circuit arrangement are provided which include applying a load current, providing a gate-back regulation circuit coupled to the load current, and enabling the gate-back regulation circuit based at least on a condition independent of the load current.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with devices, and various embodiments are described in connection with methods, however it is to be understood that embodiments described in connection with devices may apply to the methods as well, and vice versa.

The word “exemplary” is used herein to mean “serving as an example, instance, or illustration”. Any embodiment or design described herein as “exemplary” is not necessarily to be construed as preferred or advantageous over other embodiments or designs.

The words “coupled” or “connected” used with regards to a first member being “coupled” or “connected” with a second member, may be used herein to mean that the first member may be “directly mechanically connected” with the second member or “indirectly mechanically connected” with the second member, wherein an additional member or more than one additional members may be arranged in between the first and the second member such that the additional member or the more than one additional members may provide the physical connection. The words “selectively coupled” or “selectively connected” used with regards to a first member being “selectively coupled” with a second member, may be used herein to mean that the first member may be “directly selectively connected” with the second member or “indirectly selectively connected” with the second member, wherein an additional member or more than one additional members may be arranged in between the first and the second member such that the additional member or the more than one additional members may provide the selective connection.

Figure 1:
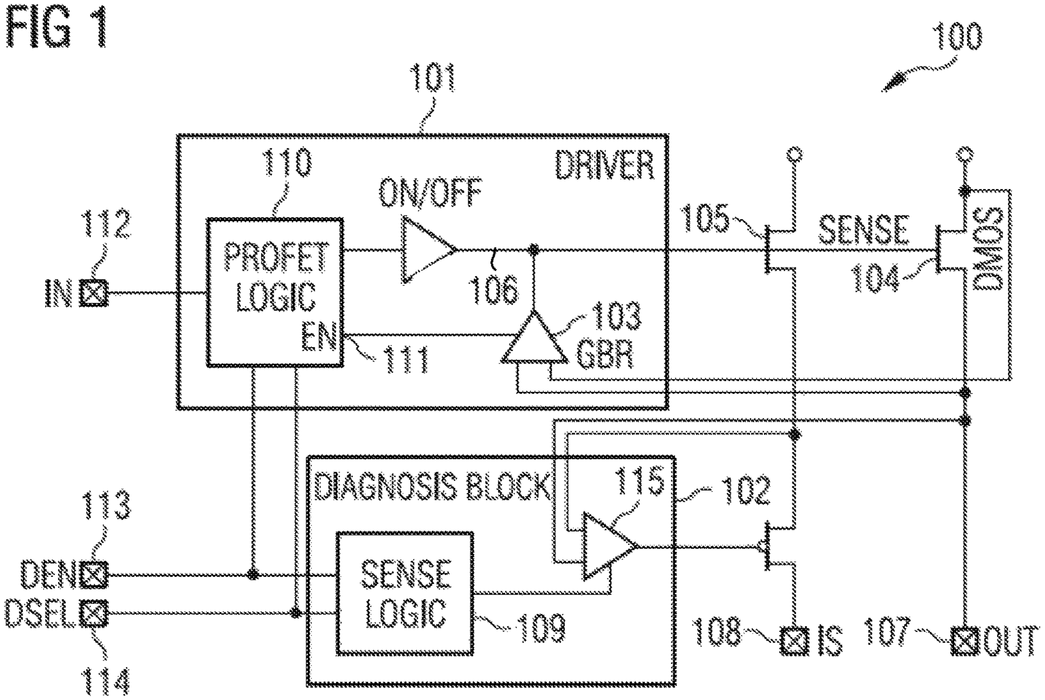
FIG. 1 illustrates a current measurement circuit arrangement having a driver circuit, a gate-back regulation circuit, and a diagnostic circuit.

FIG. 1 illustrates a current measurement circuit arrangement 100 having a driver circuit 101 configured to deliver a switching signal 106 to a power switch 104, such that power switch 104 further controls a load current flowing to output terminal 107. Circuit arrangement 100 also has a diagnostic circuit 102 configured to collect diagnostic information. Diagnostic information may be collected, for example, from sense switch 105. Circuit arrangement 100 may further have a gate-back regulation circuit 103, shown here as an operational amplifier, which is selectively connected to driver circuit 101 and the load current. Diagnostic circuit 102 may provide an enabling signal 111, which allows gate-back regulation circuit 103 to become active. In FIG. 1, enabling signal 111 is shown as being generated by a logic block 110 within driver circuit 101. However, enabling signal 111 may be generated by other components within circuit arrangement 100, for example, by a logic block 109 in diagnostic circuit 102. In various embodiments, diagnostic circuit 102 may include a sense operational amplifier 115, which may be coupled to an enabling signal. Enabling signal 111 depends on conditions in circuit arrangement 100 which are independent of the load current.

In one embodiment, diagnostic circuit 102 is configured to engage enabling signal 111 when diagnostic circuit 102 is active. This may occur, for example, when diagnostic circuit 102 is used to measure the current across sense switch 105. In particular, input pins 113 and 114 may be provided which, depending on what signals are applied respectively to input pins 113 and 114, may activate diagnostic circuit 102. For example, input pin 113 may be diagnostic enable pin. When it is engaged, diagnostic circuit 102 may be turned on, thereby engaging enabling signal 111.

When enabling signal 111 is engaged, gate-back regulation circuit 103 is allowed to activate, for example, to allow circuit arrangement 100 to operate in GBR mode. Enabling signal 111 does not necessarily activate gate-back regulation circuit 103, as other factors may determine whether this is allowed. For example, gate-back regulation circuit 103 may be configured to activate only when the load current is in a predefined range. Conversely, disengagement of enabling signal 111 may disable gate-back regulation circuit 103. In other words, although enabling signal 111 may be coupled to gate-back regulation circuit 103, it is necessary, but not sufficient, for enabling signal 111 to be engaged in order to activate gate-back regulation circuit 103.

In one embodiment, sense operational amplifier 115 may be configured to regulate the ratio of the load current with respect to a further current in the circuit arrangement. This ratio may be the ratio of the current through power switch 104 to the current through sense switch 105, also known as “KILIS”, or simply “K”.

In one embodiment, sense operational amplifier 115 is configured to maintain the KILIS ratio between a minimum and a maximum, which may be referred to as the “spread”. The spread may, for example, be maintained between 3500 and 4500 (i.e., the load current is 3500 to 4500 times greater than the current through sense switch 105) but the spread may vary depending on the operating conditions of circuit arrangement 100.

Figure 4:
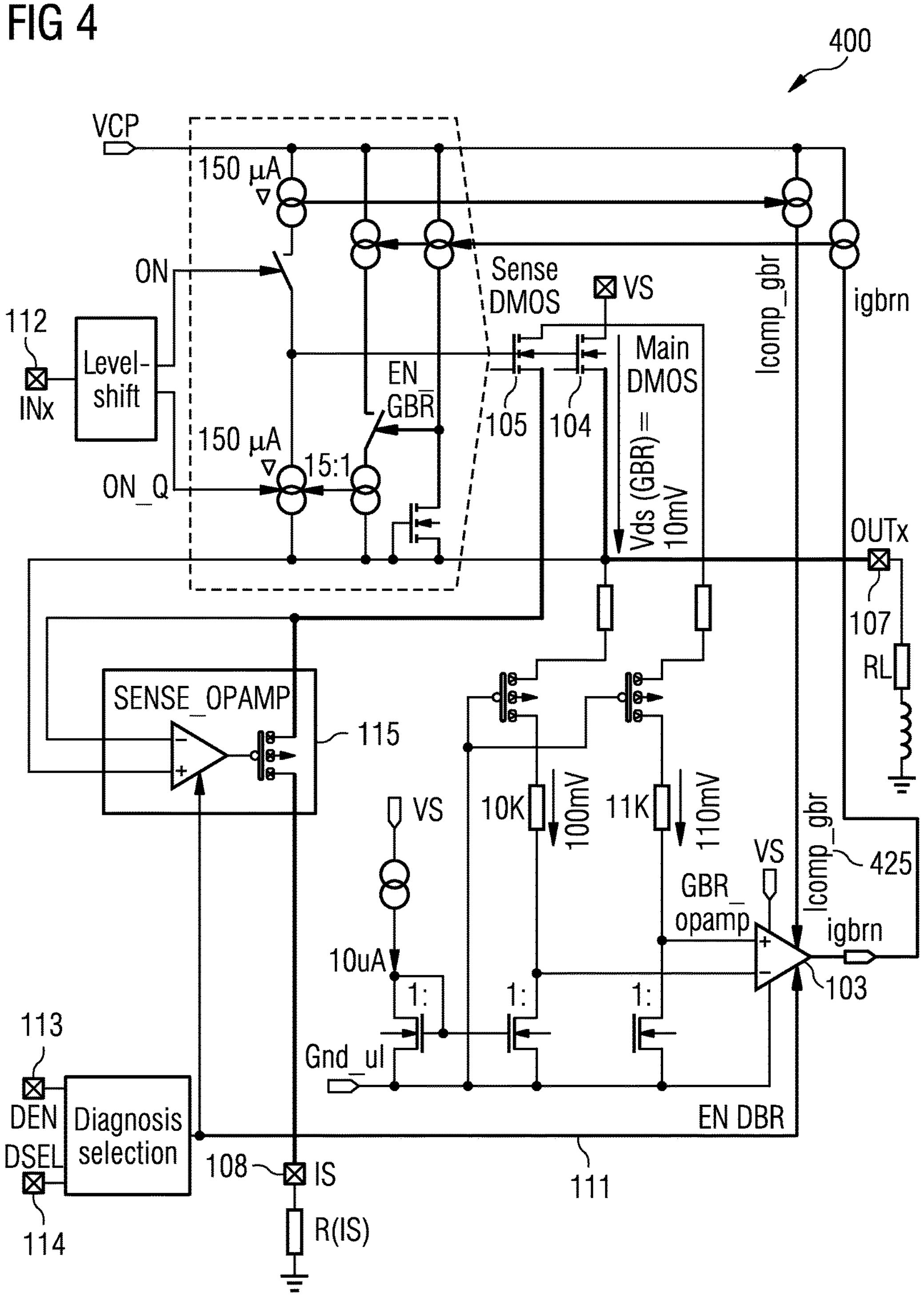
FIG. 4 illustrates a current measurement circuit arrangement having a compensation signal.

Activation of gate-back regulation circuit 103 may allow circuit arrangement 100 to operate in gate-back regulation (“GBR”) mode. In one embodiment, gate-back regulation circuit 103 includes an operational amplifier. The output of the operational amplifier may be coupled to power switch 104 or sense switch 105, or both. In a further embodiment, gate-back regulation circuit 103 may be coupled to the gate, source, or drain of switches 104, 105. In a further embodiment, gate-back regulation circuit 103 may be coupled to a compensation signal 425 (as shown in FIG. 4). In various embodiments, the drain-source voltage of power switch 104 is coupled to the input of gate-back regulation circuit 103.

Several conditions may lead to enabling signal 111 being engaged or disengaged. In one embodiment, enabling signal 111 is engaged when diagnostic circuit 102 is active, and disengaged when diagnostic circuit 102 is inactive. This may correspond to when circuit arrangement 100 is used to make a measurement or collect diagnostic information. In one embodiment, enabling signal 111 may be generated based on multiple input pins 113, 114. For example, if diagnostic enable pin 113 is active, then enabling signal 111 may be engaged.

In a further embodiment, the enabling signal 111 may be disengaged prior to increasing the load current by a certain amount, for example, during a “load jump”, in which the current increases from a low to a high current within a relatively short time.

According to various embodiments, diagnostic circuit 102 may engage enabling signal 111 until a condition is met. The condition may be that a rapid or sudden increase of current (i.e., a “current jump”) is imminent somewhere in circuit arrangement 100. Such a current jump may, for example, affect a load current. Thus, the condition may be predictive of relevant circuit characteristics. Enabling signal 111 would therefore be disengaged until the condition is lifted—for instance, once the current jump has completed, indicating that GBR mode can once again be allowed to activate. In further embodiments, the condition may be dependent on factors external to circuit arrangement 100. For example, an attached microcontroller (such as microcontroller 203 shown in FIG. 2) may provide information indicating that enabling signal 111 should be disengaged.

In a further embodiment, diagnostic circuit 102 may be configured to engage enabling signal 111 based on a predetermined timed schedule. The time schedule may, for example, indicate time periods in which a current jump or other adverse condition cannot occur. Alternatively, the time schedule may indicate time periods in which it is known that a measurement may or conversely may not be expected.

In a further embodiment, the enabling signal 111 may be disengaged when the load current exceeds a threshold value. For example, a threshold value of 2.5 amperes may be used. Detection of a threshold value may be performed by, for example, driver circuit 101 or diagnostic circuit 102.

In a further embodiment, the enabling signal 111 may be engaged in scheduled intervals of time. For example, regular measurements may be performed with diagnostic circuit 102, during which enabling signal 111 is engaged. Such a schedule could be performed by, for example, diagnostic circuit 102 or driver circuit 101.

Generation of enabling signal 111 may depend on any of the components or conditions in circuit arrangement 100. At least one of such components or conditions may be independent of the load current. In some embodiments, logic blocks 109, 110 are used to determine whether enabling signal 111 should be engaged or not. As described above, information taken from anywhere in circuit arrangement 100—for example, the load current; input pins 112, 113, 114; power switch 104 or sense switch 105; and gate-back regulation circuit 103—may be used to set enabling signal 111. Additionally, information taken from outside circuit arrangement 100 may be used to set enabling signal 111.

Input pins 112, 113, 114 may serve purposes other than engaging enabling signal 111. Input pin 113 may, for example, be a diagnostic enable pin, which may activate diagnostic circuit 102 or engage enabling signal 111, or both. Input pin 114 may be a diagnostic select pin, for example, used to specify to a channel or component to be measured.

Power switch 104, sense switch 105, and the other switches described herein may be realized, for example, as a transistor, field effect transistor (FET), metal-oxide semiconductor FET (MOSFET), power MOSFET, double-diffused MOSFET (DMOS), junction gate FET (JFET), or bipolar junction transistor (BJT).

In circuit arrangement 100, power switch 104 and sense switch 105 may be arranged such that the current through the power switch 104 is a multiple of the current through sense switch 105. Power switch 104 may be arranged as a high-side switch or as a low-side switch. Sense switch 105 may also be arranged as a high-side switch or a low-side switch.

In various embodiments, circuit arrangement 100 may be an integrated circuit. Circuit arrangement 100 may additionally be used in automotive equipment and for testing automotive equipment.

Figure 2:
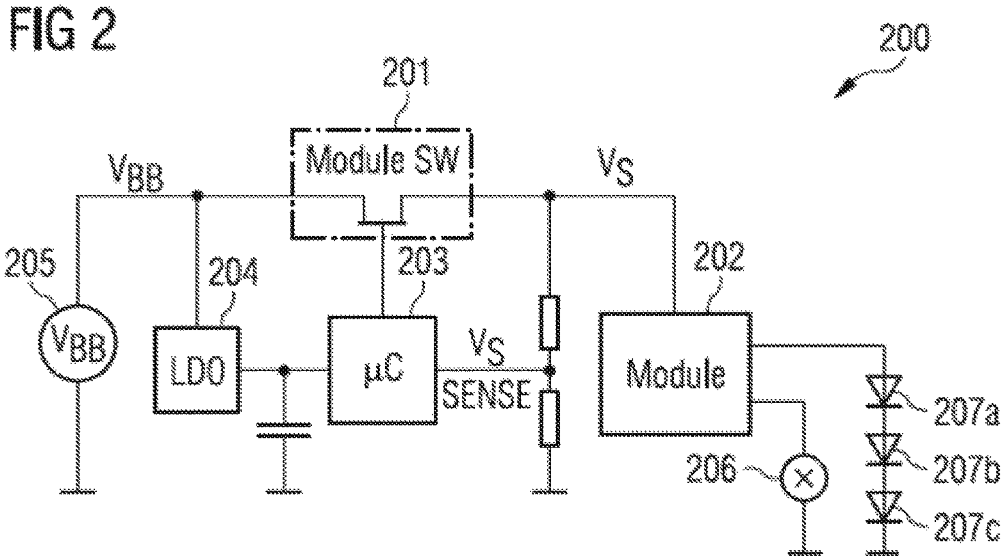
FIG. 2 illustrates a circuit arrangement for which a current measurement circuit arrangement may be used.

FIG. 2 illustrates an example circuit arrangement 200 for which current measurement circuit arrangement 100 may be used. Circuit arrangement 200 may include a module switch 201, a module 202 coupled between module switch 201 and one or more output loads 206, 207. A microcontroller 203 may be coupled to module switch 201, module 202, and/or power switch 104. Circuit arrangement 200 may further comprise a voltage source 205, such as a battery or other source of voltage or current, and a voltage regulator 204 coupled to microcontroller 203. Voltage regulator 204 may, for example, be a low-dropout regulator.

Circuit arrangement 200 may have an output load, which in some embodiments may comprise multiple loads 206, 207. Some or all of these loads may be coupled to output terminal 107, shown in FIG. 1. In the case of multiple loads, each load may have different power requirements and therefore consume different currents. Some of the loads may receive a low current while others receive a high current. This disparity may contribute to load jumps as described above. Here, "low" and "high" currents may be understood relative to one another. In some embodiments, a low current may be 100 milli-amperes or less; a high current may be 1 ampere or more. The difference in currents between loads may be due to differences in load types. For example, load 207 may comprise a light-emitting diode (LED) or chain of LEDS 207*a*-207*c* and may receive a low current. LEDs 207*a*-207*c* may be used for a display, such as in an automotive setting. Load 206 may be, for example, a light bulb or headlamp for an automobile and require a high current. It should be understood that these examples are illustrative and that the load or loads could be any electronic components.

Figure 3:
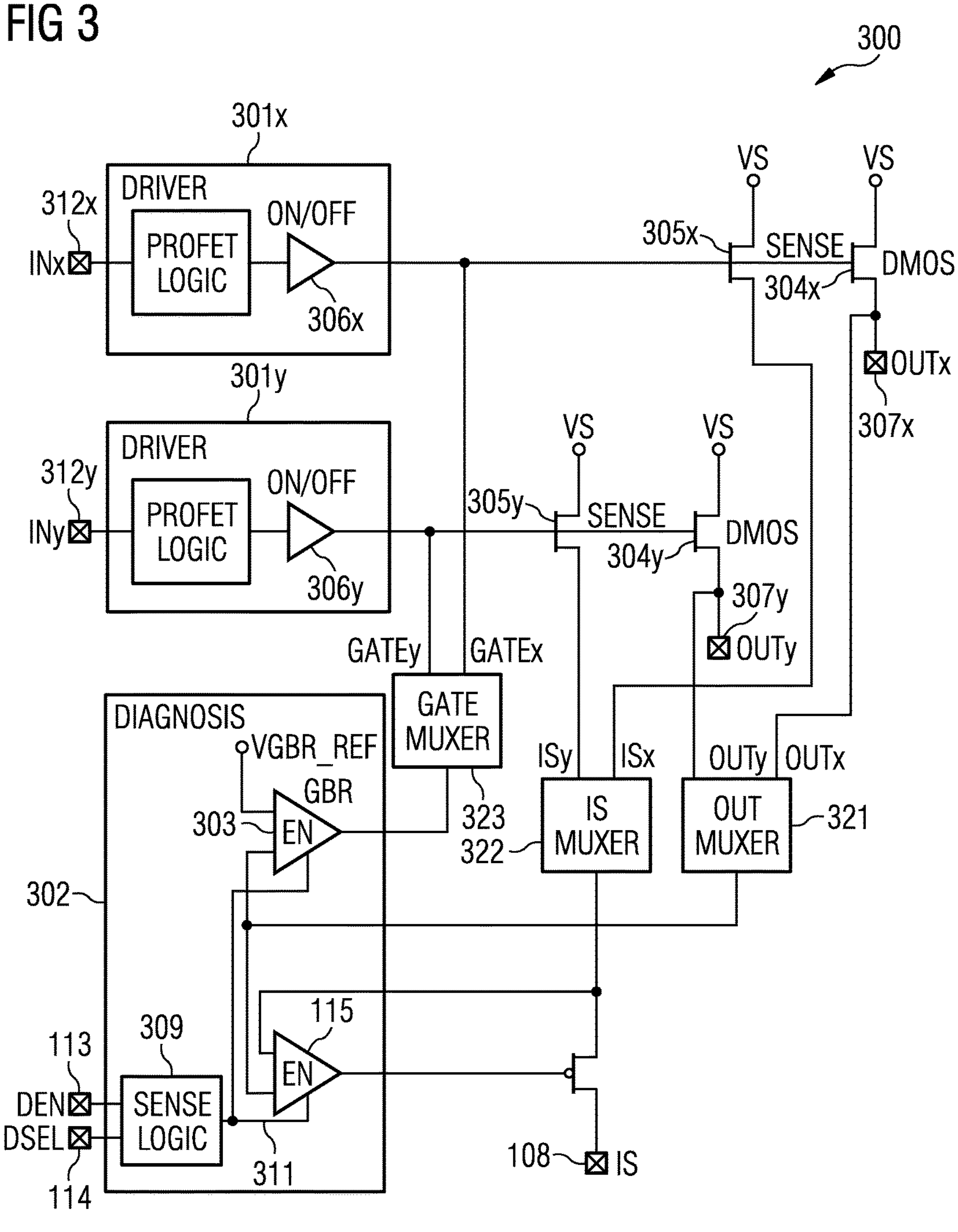
FIG. 3 illustrates a current measurement circuit arrangement having multiple driver circuits, a gate-back regulation circuit, and a diagnostic circuit.

FIG. 3 illustrates a circuit arrangement 300 having multiple driver circuits 301*x*, 301*y* coupled to respective load currents. Similar to circuit arrangement 100 shown in FIG. 1, each driver circuit 301 comprises a power switch 304 and is configured to deliver a switching signal 306 to power switch 304, such that power switch 304 controls its respective load current. Circuit arrangement 300 may also include a diagnostic circuit 302 configured to collect diagnostic information and a gate-back regulation circuit 303 selectively connected to driver circuits 301*x*, 301*y* and the respective load currents. An enabling signal 311, which is independent of the load currents, allows gate-back regulation circuit 303 to become active. Circuit arrangement 300 illustrates an embodiment where enabling signal 311 may be generated by a sense logic block 309, arranged in diagnostic circuit 302.

In one embodiment, an output multiplexer 321 and a sense multiplexer 322 may be used to select which driver circuit 301 and corresponding load current is measured. Output multiplexer 321 may select and channel a respective current load from one of the power switches 304*x*, 304*y* to gate-back regulation circuit 303. Sense multiplexer 322 may correspondingly select and channel the output from one of the sense switches 305*x*, 305*y* to, for example, sense pin 108. Gate demultiplexer 323 may couple the output of gate-back regulation circuit 303 to the gates of either power switch 304*x* and sense switch 305*x*, or of power switch 304*y* and sense switch 305*y*. In one embodiment, multiplexers 321, 322 and demultiplexer 323 may be coupled to input pins 113 and 114. For example, diagnostic select pin 114 may specify which channel of multiplexers 321, 322 and demultiplexer 323 is selected. This embodiment allows a single diagnostic circuit 302 and single gate-back regulation circuit 303 to be used for circuit arrangement 300.

Circuit arrangement 300 is depicted as having two driver circuits. With multiplexers 321, 322 and demultiplexer 323, the arrangement can be scaled to accommodate an arbitrary number of inputs 312*x*, 312*y* and driver circuits 301*x*, 301*y*. Though the number of driver circuits may be made arbitrarily large (i.e., three or more) circuit arrangement 300 will still operate adequately with diagnostic circuit 302 and gate-back regulation circuit 303 as described for the case where there are only two driver circuits. Additionally, a reference voltage may be coupled to the input of gate-back regulation circuit 303.

FIG. 4 illustrates a circuit arrangement having a compensation signal. In current measurement circuit arrangement 400, a compensation signal 425 is provided which may compensate the systematic offset of gate-back regulation circuit 103 caused by an output current needed to drive the current igbrn. Compensation signal 425 may for example be dependent on the topology inside an operational amplifier GBR_opamp used in gate-back regulation circuit 103. In circuit arrangement 400, for example, GBR_opamp may be a folded cascode circuit. Compensation signal 425 may be coupled to gate-back regulation circuit 103. Circuit arrangement 400 may provide an implementation for a current measurement circuit arrangement such as those found in FIGS. 1-3.

Figure 5:
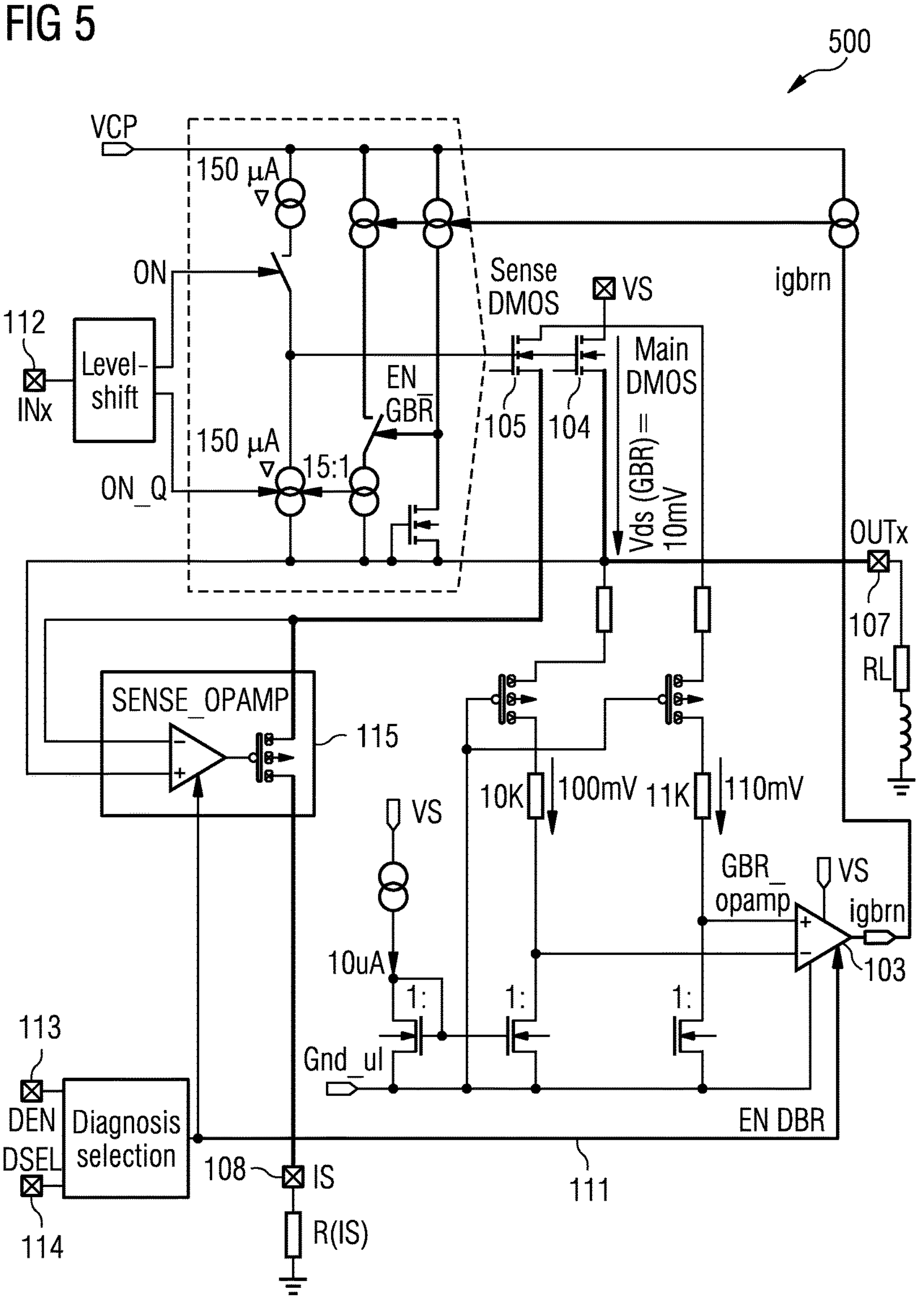
FIG. 5 illustrates a current measurement circuit arrangement.

FIG. 5 illustrates a circuit arrangement having no compensation signal. Current measurement circuit arrangement 500 may provide an implementation for a current measurement circuit arrangement such as those found in FIGS. 1-3.

Figure 6:
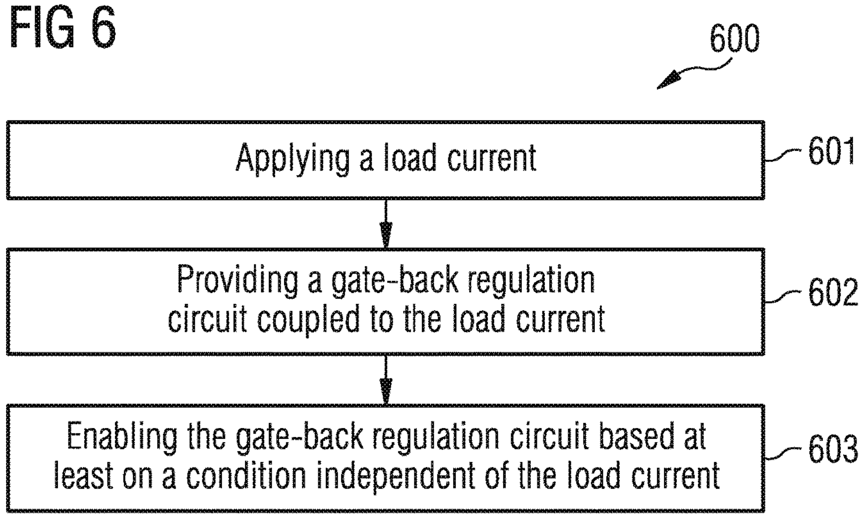
FIG. 6 illustrates a method to operate a current measurement circuit arrangement.
Figure 7:
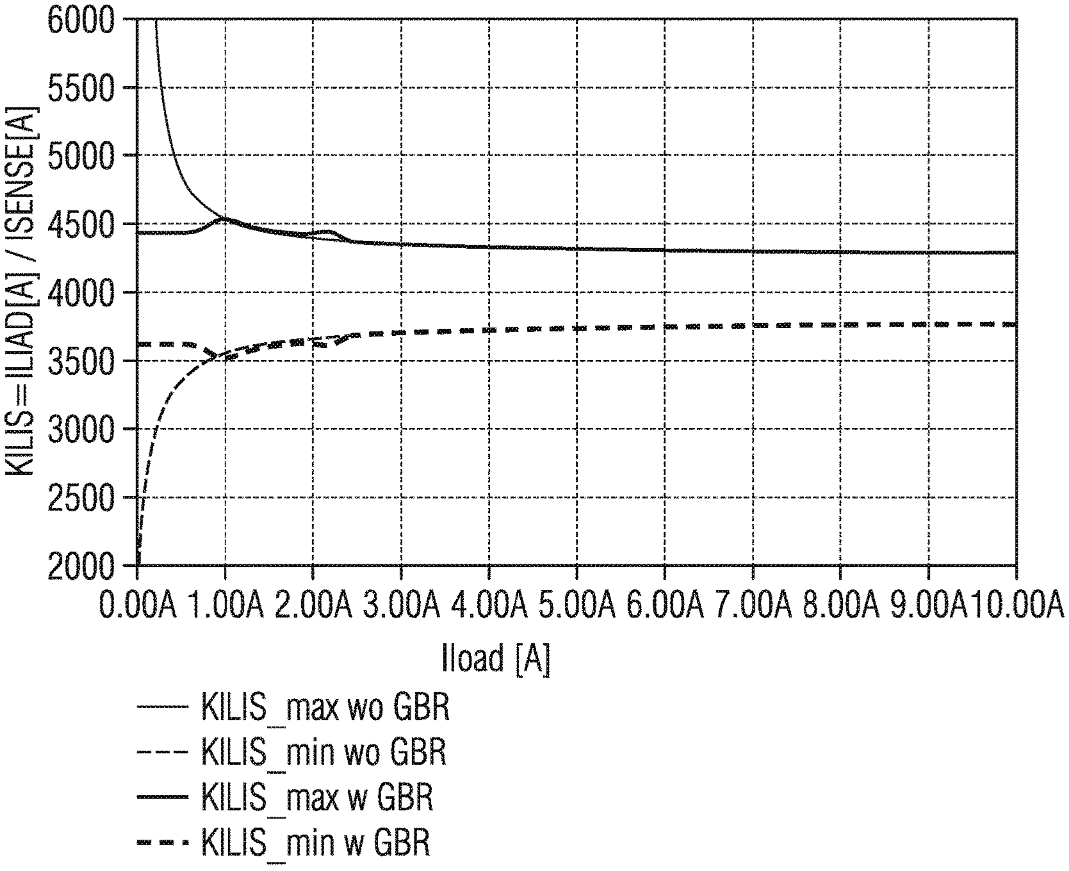
FIG. 7 illustrates typical diagnosis behavior for a parameter K under different operating conditions.
Figure 8A:
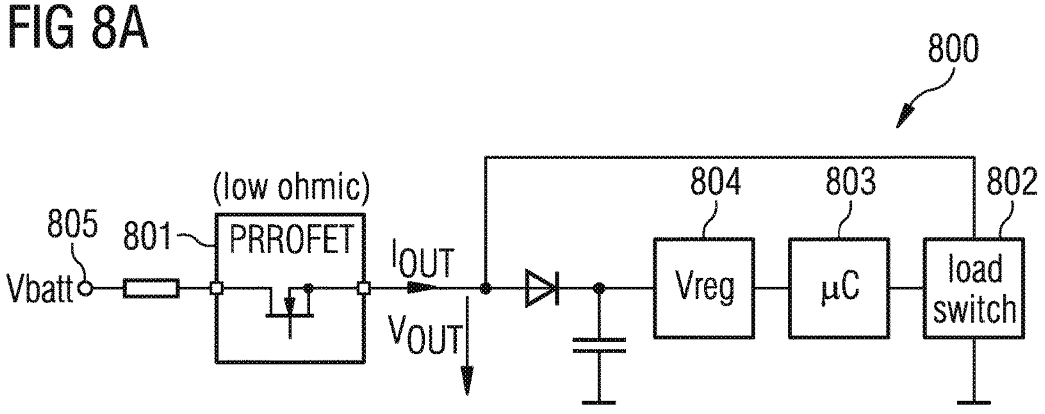
FIG. 8A illustrates a circuit arrangement.
Figure 8B:
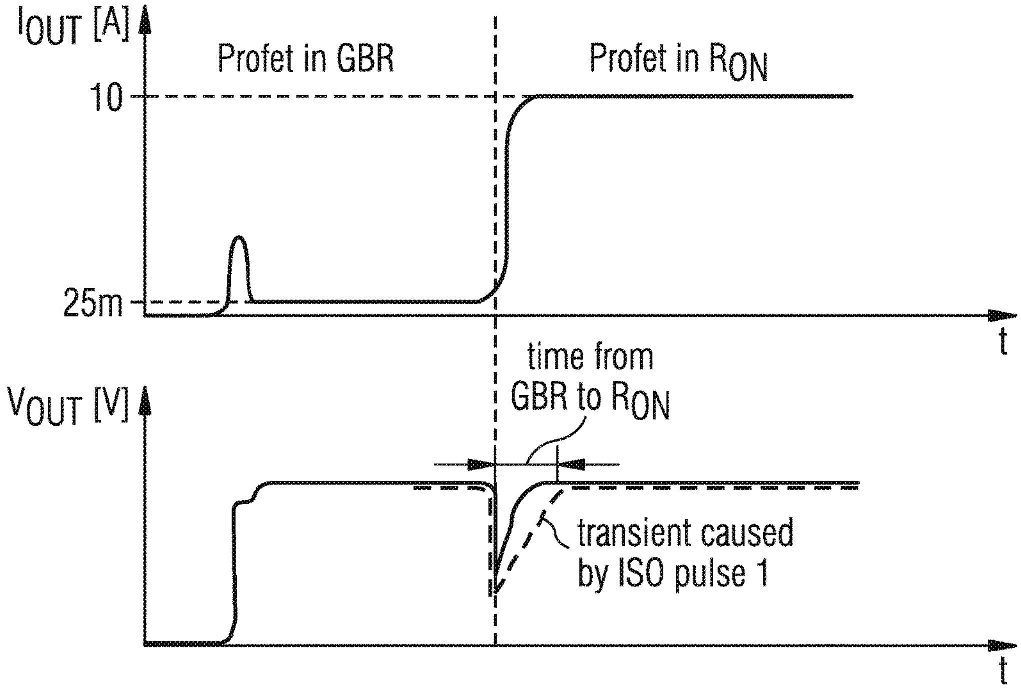
(PRIOR ART) FIG 8B
FIG. 8B illustrates circuit behavior during operation of a circuit arrangement.
Figure 9:
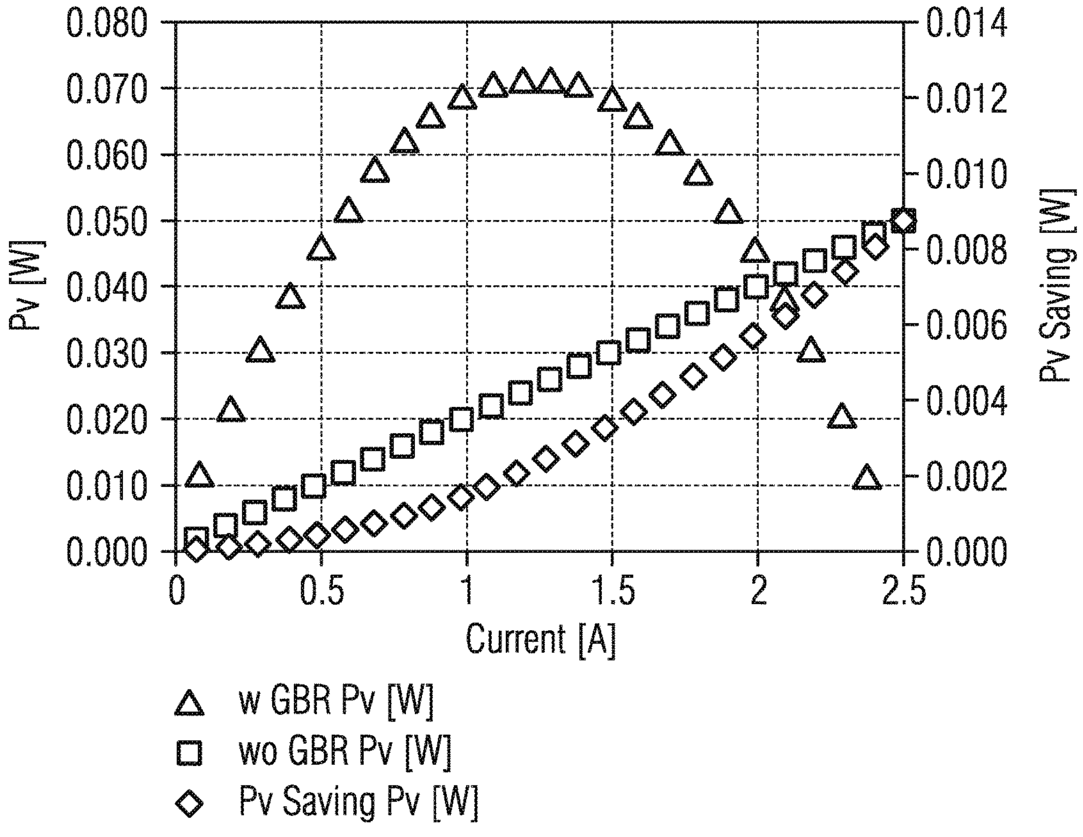
FIG. 9 illustrates power consumption of a circuit arrangement under different operating conditions.

FIG. 6 illustrates a flow diagram of a method for operating a circuit arrangement according to various embodiments, such as the circuit arrangements shown in FIGS. 1 and 3. Method 600 may include 601, applying a load current, in 602, providing a gate-back regulation circuit coupled to the load current, and in 603, enabling the gate-back regulation circuit based at least on a condition independent of the load current. Method 600 may further describe the operation of a circuit arrangement having multiple load currents, as depicted in FIG. 3.

According to various embodiments, a circuit arrangement may include a driver circuit configured to deliver a switching signal to a power switch such that the power switch controls a load current, a gate-back regulation circuit selectively connected to the driver circuit and the load current, and a diagnostic circuit configured to provide an enabling signal, which allows the gate-back regulation circuit to become active. The enabling signal may be dependent at least in part on a condition independent of the load current.

According to various embodiments, the diagnostic circuit or the driver circuit may be further configured to engage the enabling signal when the diagnostic circuit is active.

According to various embodiments, the gate-back regulation circuit is configured to regulate a ratio of the load current with respect to a current through the diagnostic circuit.

According to various embodiments, the gate-back regulation circuit may be configured to maintain the ratio between a minimum and a maximum. According to various embodiments, the minimum may be 3500 and the maximum may be 4500.

According to various embodiments, the gate-back regulation circuit may be disabled when the load current exceeds a predetermined threshold.

According to various embodiments, the gate-back regulation circuit may regulate the drain-source voltage of the switching signal by decreasing the gate voltage of the switching signal.

According to various embodiments, the diagnostic circuit or the driver circuit may be configured to disengage the enabling signal prior to increasing the load current.

According to various embodiments, the diagnostic circuit or the driver circuit may be configured to disengage the enabling signal when the load current exceeds a predetermined threshold.

According to various embodiments, the diagnostic circuit or the driver circuit may be configured to engage the enabling signal for scheduled periods of time.

According to various embodiments, the diagnostic circuit may be configured to engage the enabling signal prior until the condition is satisfied.

According to various embodiments, the condition may be predictive of a current jump.

According to various embodiments, the condition may be dependent on factors external to the circuit arrangement.

According to various embodiments, the diagnostic circuit may be configured to engage the enabling signal based on a predetermined time schedule.

According to various embodiments, the diagnostic circuit may comprise a plurality of input pins.

According to various embodiments, one of the plurality of input pins may enable the diagnostic circuit. According to various embodiments, one of the plurality of input pins may select a measurement target.

According to various embodiments, the driver circuit may be further configured to engage the enabling signal based on the values of the plurality of input pins.

According to various embodiments, the gate-back regulation circuit may comprise an operational amplifier.

According to various embodiments, the circuit arrangement may further include a compensation signal, wherein the gate-back regulation circuit is coupled to the compensation signal.

According to various embodiments, the circuit arrangement may comprise an output load coupled to the load current.

According to various embodiments, the output load may comprise a plurality of loads. According to various embodiments, the plurality of loads may receive different currents.

According to various embodiments, one of the plurality of loads may receive a low current and one of the plurality of loads may receive a high current. According to various embodiments, a low current is less than 100 mA and a high current is greater than 1 A.

According to various embodiments, the plurality of loads receiving the low current may comprise a light-emitting diode. According to various embodiments, the light-emitting diode may be for a display.

According to various embodiments, the plurality of loads receiving the high current may comprise a light bulb. According to various embodiments, the light bulb may be a headlamp.

According to various embodiments, the power switch may be a high-side switch.

According to various embodiments, the power switch may be a low-side switch.

According to various embodiments, the power switch may comprise a field effect transistor (FET). According to various embodiments, the power switch may comprise a MOSFET. According to various embodiments, the power switch may comprise a bipolar transistor.

According to various embodiments, a gate of the power switch may be coupled to the output of the gate-back regulation circuit.

According to various embodiments, the circuit arrangement may further comprise a microcontroller. According to various embodiments, the microcontroller may be coupled to the power switch.

According to various embodiments, the diagnostic circuit may comprise an operational amplifier. According to various embodiments, the operational amplifier may be coupled to the enabling signal.

According to various embodiments, the circuit arrangement may be an integrated circuit.

According to various embodiments, the circuit arrangement may be used in an automobile.

According to various embodiments, the circuit arrangement may include a plurality of driver circuits, wherein each driver circuit comprises a power switch and is configured to deliver a switching signal to the power switch such that the power switch controls a respective load current, a gate-back regulation circuit selectively connected to the plurality of power circuits and the plurality of load currents, and a diagnostic circuit configured to provide an enabling signal, which allows the gate-back regulation circuit to become active. The enabling signal may be dependent on at least a condition independent of the plurality of load currents.

According to various embodiments, the diagnostic circuit or the driver circuit may be further configured to engage the enabling signal when the diagnostic circuit is active.

According to various embodiments, the diagnostic circuit may be configured to select one of the plurality of load currents for collecting diagnostic information.

According to various embodiments, the circuit arrangement may comprise a multiplexer coupled to the plurality of load currents.

According to various embodiments, the circuit arrangement may comprise at least one multiplexer.

According to various embodiments, the at least one multiplexer may be configured to select one of the plurality of load currents.

According to various embodiments, the at least one multiplexer may be configured to select a measurement voltage associated with one of the plurality of load currents.

According to various embodiments, the at least one multiplexer may be configured to selectively output a measurement voltage associated with one of the plurality of load currents.

According to various embodiments, the circuit arrangement may comprise at least one demultiplexer.

According to various embodiments, the at least one demultiplexer may be coupled to the enabling signal and the plurality of driver circuits.

According to various embodiments, the at least one demultiplexer may be configured to selectively output the enabling signal to one of the plurality of driver circuits.

According to various embodiments, a method for operating a circuit arrangement may comprise applying a load current; providing a diagnostic circuit coupled to the load current; providing a gate-back regulation circuit coupled to the load current; and enabling the gate-back regulation circuit based at least on a condition independent of the load current.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A circuit arrangement comprising:

a driver circuit configured to deliver a switching signal to a power switch such that the power switch controls a load current;

a gate-back regulation circuit connected to the load current; and a diagnostic circuit configured to provide an enabling signal, which allows the gate-back regulation circuit to become active; wherein the diagnostic circuit is configured to receive information from the power switch;

wherein the enabling signal is dependent at least in part on a condition independent of the load current.

2. The circuit arrangement of claim 1, wherein the gate-back regulation circuit is disabled when the load current exceeds a predetermined threshold.

3. The circuit arrangement of claim 1, wherein the diagnostic circuit is configured to disengage the enabling signal prior to the load current being increased.

4. The circuit arrangement of claim 1, wherein the diagnostic circuit is configured to disengage the enabling signal when the load current exceeds a predetermined threshold.

5. The circuit arrangement of claim 1, wherein the diagnostic circuit is configured to engage the enabling signal until the condition is satisfied.

6. The circuit arrangement of claim 5, wherein the condition is predictive of a current jump.

7. The circuit arrangement of claim 5, wherein the condition is dependent on factors external to the circuit arrangement.

8. The circuit arrangement of claim 1, wherein the diagnostic circuit is configured to engage the enabling signal based on a predetermined time schedule.

9. The circuit arrangement of claim 1, wherein the driver circuit is further configured to engage the enabling signal when the diagnostic circuit is active.

10. The circuit arrangement of claim 9, further comprising a plurality of input pins coupled to the diagnostic circuit.

11. The circuit arrangement of claim 10, wherein one of the plurality of input pins enables the diagnostic circuit.

12. The circuit arrangement of claim 10, wherein one of the plurality of input pins selects a measurement target.

13. The circuit arrangement of claim 10, wherein the diagnostic circuit is further configured to engage the enabling signal based on the values of the plurality of input pins.

14. The circuit arrangement of claim 1, further comprising a compensation signal;

wherein the gate-back regulation circuit is coupled to the compensation signal.

15. The circuit arrangement of claim 1, wherein the operation of the gate-back regulation circuit is independent of the load current.

16. The circuit arrangement of claim 1, further comprising an output load coupled to the load current.

17. The circuit arrangement of claim 16, wherein the output load comprises a plurality of loads.

18. The circuit arrangement of claim 17, wherein the plurality of loads receive different currents.

* * * * *